US009158212B2

(12) United States Patent
Ishigo

(10) Patent No.: US 9,158,212 B2
(45) Date of Patent: Oct. 13, 2015

(54) EXPOSURE APPARATUS, EXPOSURE CONTROL SYSTEM, AND EXPOSURE METHOD

(75) Inventor: Kazutaka Ishigo, Mie (JP)

(73) Assignee: Kabushiki Kaisha Toshiba, Tokyo (JP)

(*) Notice: Subject to any disclaimer, the term of this patent is extended or adjusted under 35 U.S.C. 154(b) by 504 days.

(21) Appl. No.: 13/601,311

(22) Filed: Aug. 31, 2012

(65) Prior Publication Data
US 2013/0222777 A1  Aug. 29, 2013

(30) Foreign Application Priority Data

Feb. 23, 2012  (JP) .................................. 2012-037417

(51) Int. Cl.
*G03B 27/52* (2006.01)
*G03F 7/20* (2006.01)
*G03F 9/00* (2006.01)

(52) U.S. Cl.
CPC ........ *G03F 7/70783* (2013.01); *G03F 7/70641* (2013.01); *G03F 9/7019* (2013.01)

(58) Field of Classification Search
CPC ............ G03F 7/70783; G03F 7/70641; G03F 7/7085; G03F 9/7019; G03F 9/7026; G03F 7/70683; G03F 9/7011; G03F 9/7003; G03F 7/70725; G03F 9/7088; G03F 1/36; G03F 7/24; G03F 7/70283
USPC ..................................................... 355/53, 67
See application file for complete search history.

(56) References Cited

U.S. PATENT DOCUMENTS

| 5,879,845 | A | 3/1999 | Takahashi |
| 6,514,122 | B2 | 2/2003 | Saito et al. |
| 7,113,256 | B2 | 9/2006 | Butler et al. |
| 2002/0042664 | A1* | 4/2002 | Kikuchi ........................ 700/114 |
| 2004/0126004 | A1 | 7/2004 | Kikuchi et al. |
| 2005/0157296 | A1 | 7/2005 | Hayano et al. |
| 2005/0179880 | A1 | 8/2005 | Butler et al. |

(Continued)

FOREIGN PATENT DOCUMENTS

| EP | 1 566 696 B1 | 8/2007 |
| JP | 2002-50562 A | 2/2002 |
| JP | 3412981 B | 3/2003 |

OTHER PUBLICATIONS

Combined Chinese Office Action and Search Report issued Sep. 2, 2014 in Patent Application No. 201210320610.0 (with English Translation and English Translation of Category of Cited Documents).

(Continued)

*Primary Examiner* — Mesfin T Asfaw
(74) *Attorney, Agent, or Firm* — Oblon, McClelland, Maier & Neustadt, L.L.P.

(57) ABSTRACT

According to one embodiment, there is provided an exposure apparatus including an acquisition unit, and a calculation unit. The acquisition unit obtains a plurality of measured values. The plurality of measured values is measured for a plurality of focus offset quantities different from each other. Each of the plurality of measured values represents positional deviation distribution within a shot area. The calculation unit calculates a plurality of distortion errors from the plurality of measured values and obtains a correlation between the focus offset quantity and alignment compensation value to compensate for the distortion error, in response to the plurality of focus offset quantities and the plurality of distortion errors.

20 Claims, 12 Drawing Sheets

(56) References Cited

U.S. PATENT DOCUMENTS

2006/0114436 A1\* 6/2006 Oesterholt et al. .............. 355/55
2006/0279722 A1 12/2006 De Mol
2009/0011346 A1 1/2009 Ausschnitt et al.
2011/0205510 A1 8/2011 Menchtchikov et al.

OTHER PUBLICATIONS

Taiwanese Office Action issued Sep. 24, 2014, in Taiwan Patent Application No. 101130717 (with English translation).

\* cited by examiner

IOSa

IOSa

FIG.8A
$Dx = K_1 + K_3 \times x + K_5 \times y + K_7 \times x^2 + K_9 \times xy + K_{11} \times y^2 + K_{13} \times x^3 + K_{15} \times x^2y + K_{17} \times xy^2 + K_{19} \times y^3$
$Dy = K_2 + K_4 \times y + K_6 \times x + K_8 \times y^2 + K_{10} \times yx + K_{12} \times x^2 + K_{14} \times y^3 + K_{16} \times y^2x + K_{18} \times yx^2 + K_{20} \times x^3$
FIG.8B
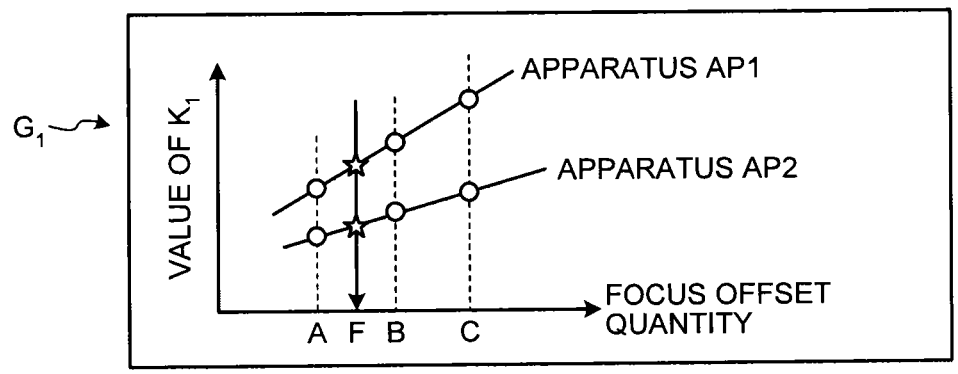
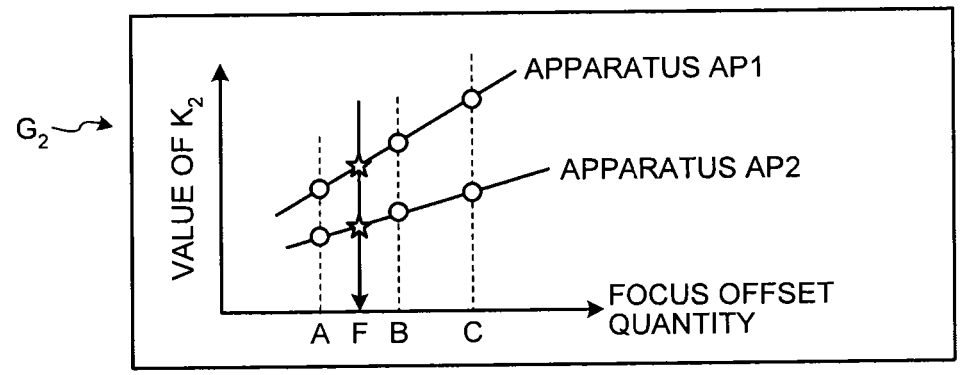
⋮
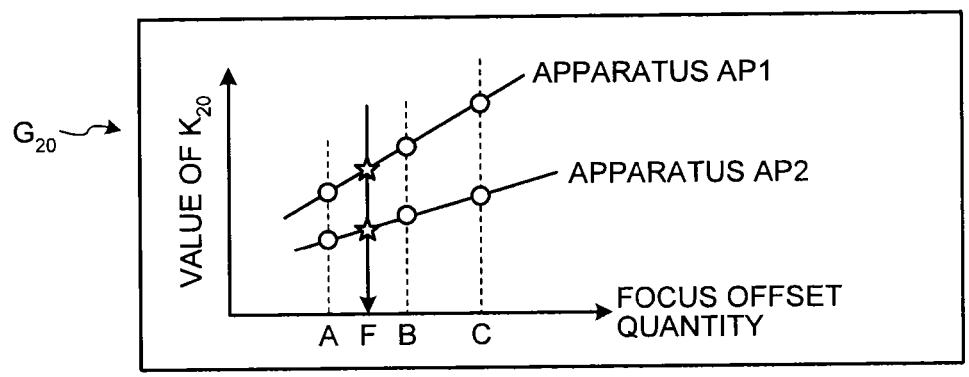

FIG.12

| 52a3 | 52a1 | 52a2-1 | 52a2-2 | | 52a2-20 |
|---|---|---|---|---|---|
| <APPARATUS IDENTIFIER> | <FOCUS OFFSET QUANTITY> | <VALUE OF $K_1$> | <VALUE OF $K_2$> | ... | <VALUE OF $K_{20}$> |
| AP1 | A | $K_{1a}$ | $K_{2a}$ | ... | $K_{20a}$ |
| AP1 | B | $K_{1b}$ | $K_{2b}$ | ... | $K_{20b}$ |
| AP1 | C | $K_{1c}$ | $K_{2c}$ | ... | $K_{20c}$ |
| ⋮ | ⋮ | ⋮ | ⋮ | ⋮ | ⋮ |
| APk | A | $K_{1ak}$ | $K_{2ak}$ | ... | $K_{20ak}$ |
| APk | B | $K_{1bk}$ | $K_{2bk}$ | ... | $K_{20bk}$ |
| APk | C | $K_{1ck}$ | $K_{2ck}$ | ... | $K_{20ck}$ |

52a

EXPOSURE APPARATUS, EXPOSURE CONTROL SYSTEM, AND EXPOSURE METHOD

CROSS-REFERENCE TO RELATED APPLICATIONS

This application is based upon and claims the benefit of priority from Japanese Patent Application No. 2012-037417, filed on Feb. 23, 2012; the entire contents of which are incorporated herein by reference.

FIELD

Embodiments described herein relate generally to an exposure apparatus, an exposure control system, and an exposure method.

BACKGROUND

An exposure apparatus performs an exposing process of transferring a mask pattern onto a substrate. For this case, when a transfer position of the mask pattern deviates from a target position on the substrate, a pattern defect may occur. Accordingly, alignment accuracy is necessary to be improved.

BRIEF DESCRIPTION OF THE DRAWINGS

FIGS. 8A and 8B are views illustrating calculation results of correlations in the first embodiment;

FIG. 12 is a view illustrating a data structure of a correlation database in a modification of the first embodiment;

DETAILED DESCRIPTION

In general, according to one embodiment, there is provided an exposure apparatus including an acquisition unit, and a calculation unit. The acquisition unit obtains a plurality of measured values. The plurality of measured values is measured for a plurality of focus offset quantities different from each other. Each of the plurality of measured values represents positional deviation distribution within a shot area. The calculation unit calculates a plurality of distortion errors from the plurality of measured values and obtains a correlation between the focus offset quantity and alignment compensation value to compensate for the distortion error, in response to the plurality of focus offset quantities and the plurality of distortion errors.

Exemplary embodiments of an exposure apparatus, an exposure control system, and an exposure method will be explained below in detail with reference to the accompanying drawings. The present invention is not limited to the following embodiments.

First Embodiment

Figure 1:
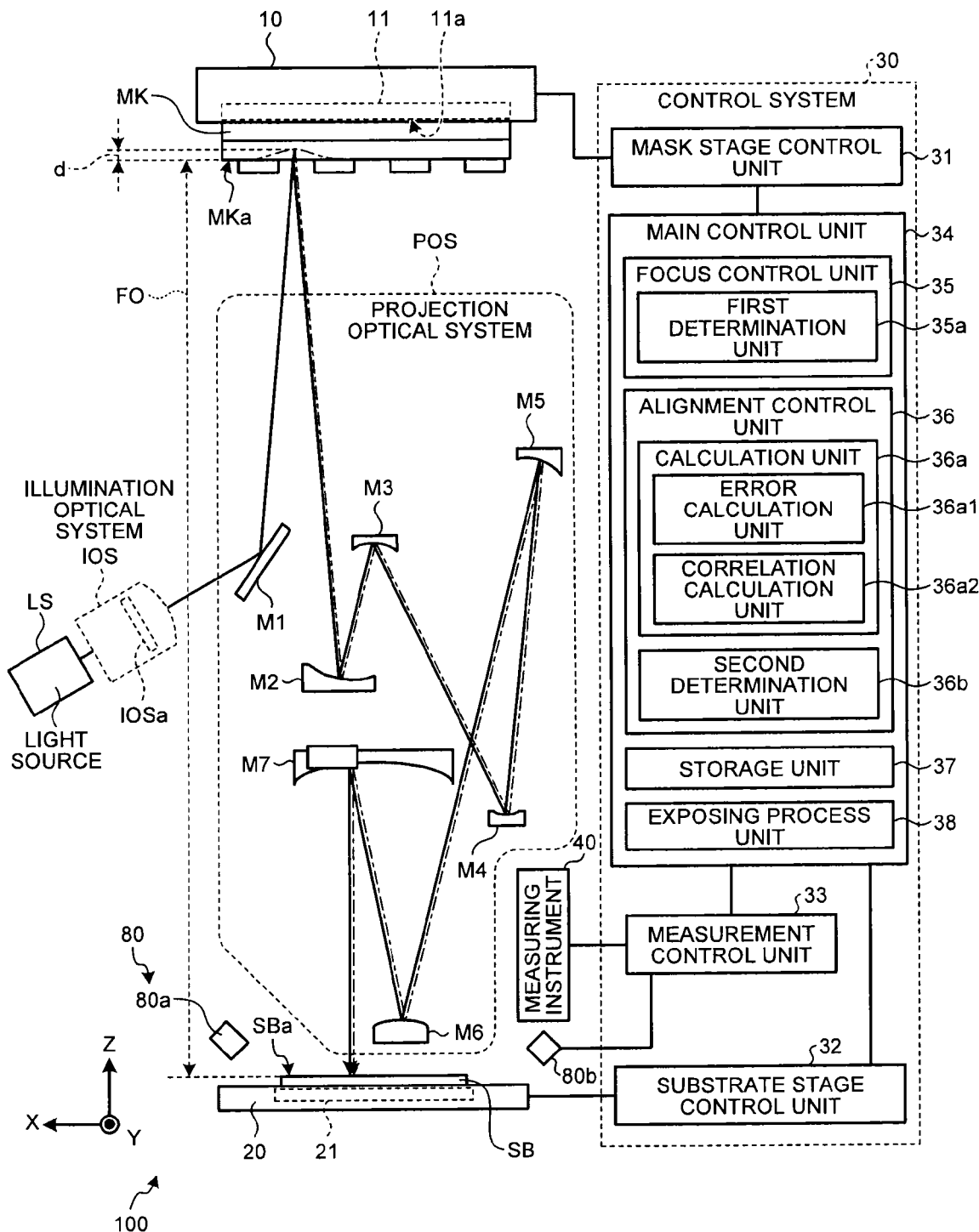
FIG. 1 is a view illustrating a configuration of an exposure apparatus according to a first embodiment.

Referring to FIG. 1, an exposure apparatus 100 according to a first embodiment is described. FIG. 1 is a view illustrating a configuration of the exposure apparatus 100.

The exposure apparatus 100 is used in a lithography process for manufacturing a semiconductor device. The exposure apparatus 100, which is, for example, a scanning type, performs an exposing process of transferring a pattern on a mask MK onto a substrate SB, scanning a mask MK and a substrate SB in a synchronizing manner in X direction. In the following description, a direction that is perpendicular to the in-plane X direction running along a surface SBa of the substrate SB is defined as Y direction, and a direction that is perpendicular to the X-Y plane is defined as Z direction.

When attempting to respond to the demand for finer semiconductor devices, with finer-scale lithography, that is, with higher resolution capability of an exposure apparatus, an immersion exposure apparatus has technical difficulty in increasing a numerical aperture of a lens (for example, NA=1.35) which is one parameter in determining the limit on pattern resolution.

Accordingly, the embodiment adopts, as the exposure apparatus 100, an EUV exposure apparatus of a reduction projection type which decreases a wavelength of light emitted from a light source LS, which is another parameter in determining the limit on pattern resolution, compared to conventional light (for example, ArF light), and uses EUV (Extreme Ultra Violet) light as exposure light. The wavelength of the EUV light is, for example, $\lambda=13.5$ nm.

In the EUV exposure apparatus, because air transmittance of the exposure light (EUV light) is very low, a passage, through which exposure light passes, needs to be in a vacuum. That is, in the exposure apparatus 100, the passage through which the exposure light passes is placed within a vacuum chamber and air is exhausted from the vacuum chamber to leave the inside of the vacuum chamber in a vacuum. Because of this, in the exposure apparatus 100, a vacuum chuck as a mechanism adsorbing the mask MK in a mask stage 10 cannot be used. This makes the mask stage 10 inevitably adsorb the mask MK using an electrostatic chuck 11.

Furthermore, since the EUV exposure apparatus uses exposure light with a very short wavelength, the EUV exposure apparatus has to use a reflecting optical system and a reflection mask, without suitable lens materials (high transmittance, difference in refractive index) for making up the refracting optical system. That is, in the exposure apparatus 100, an illumination optical system IOS and a projection optical system POS are all a reflecting optical system, and the mask MK is a reflection mask. For example, the projection optical system POS includes a plurality of mirrors M1 to M7. For example, exposure light emitted from the illumination optical system IOS and being incident on the mask MK reflects off the surface MKa of the mask MK, and is then guided through the plurality of mirrors M1 to M7, reaching the surface SBa of the substrate SB.

Figure 2:
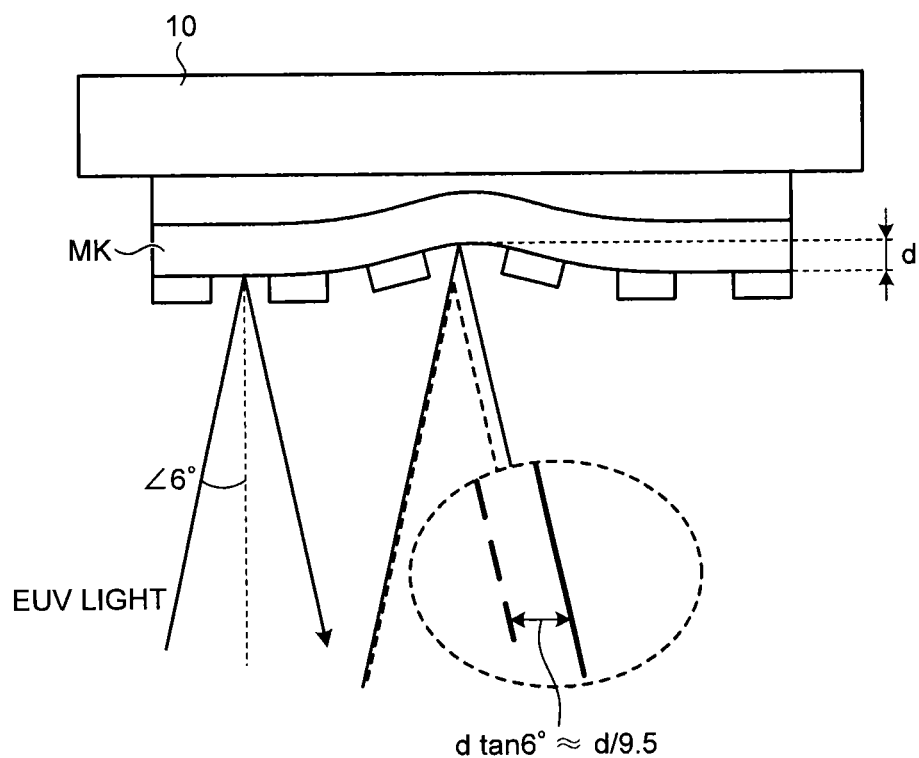
FIG. 2 is a view illustrating distortion of a mask in the first embodiment.

At this point, as illustrated in FIG. 2, the exposure light is non-telecentric with respect to the mask MK (for example, 6-degree oblique incidence). This may cause the positional deviation error that the transfer position of the exposed pattern on the substrate SB deviates from a position indicated by a solid line to a position indicated by a dashed line, as illustrated in FIG. 1, under influence of the flatness of the surface MKa of the mask MK or the flatness of a surface 11a of the electrostatic chuck 11. For example, in a case where the surface MKa of the mask MK is dented by a distance d from its original position, the center of the exposure light reflects off the mask MK and then immediately causes a positional deviation, for example, by $d*\tan 6° \approx d/9.5$ in a direction along the surface MKa of the mask MK, and causes a positional deviation, for example, by d/38 in a direction along the surface SBa of the substrate SB on the surface SBa of the substrate SB.

From the result of reviewing, the following fact was found: the positional deviation distribution within a shot area is influenced by the flatness and depends on a distance from the surface MKa of the mask MK to the surface SBa of the substrate SB, that is, the focus offset quantity FO of the exposure apparatus 100.

Figure 3A:
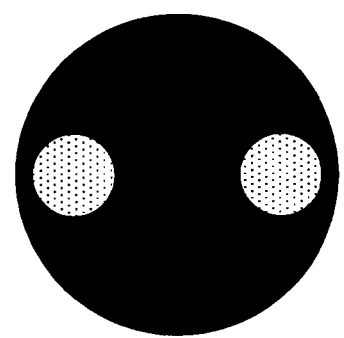
FIGS. 3A and 3B are views illustrating unbalance in diaphragm in the first embodiment.
Figure 3B:
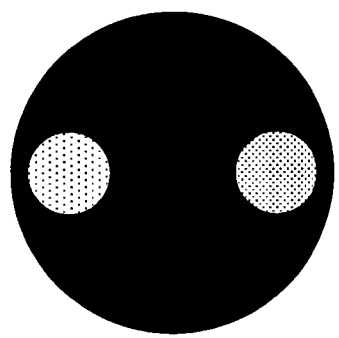

Furthermore, for example, a diaphragm with an aperture shape as in FIG. 3A is arranged in the pupil position of the illumination optical system IOS. This realizes use of dipole illumination for improving the resolution capability of the exposure apparatus 100. Since the exposure light is non-telecentric with respect to the mask MK, if the brightness balance of this dipole illumination is lost as illustrated in FIG. 3B, the transfer position of the exposure pattern on the substrate SB is easily influenced by this phenomenon, and the positional deviation error may occur such that the transfer position of the exposure pattern on the substrate SB deviates from the position indicated by a solid line to the position indicated by an dashed line, as illustrated in FIG. 1.

From the result of reviewing, the following fact was also found: the distribution of the positional deviations within a shot area (positional deviation distribution) depends also on a distance from the surface MKa of the mask MK to the surface SBa of the substrate SB, that is, the focus offset quantity FO of the exposure apparatus 100.

Figure 4:
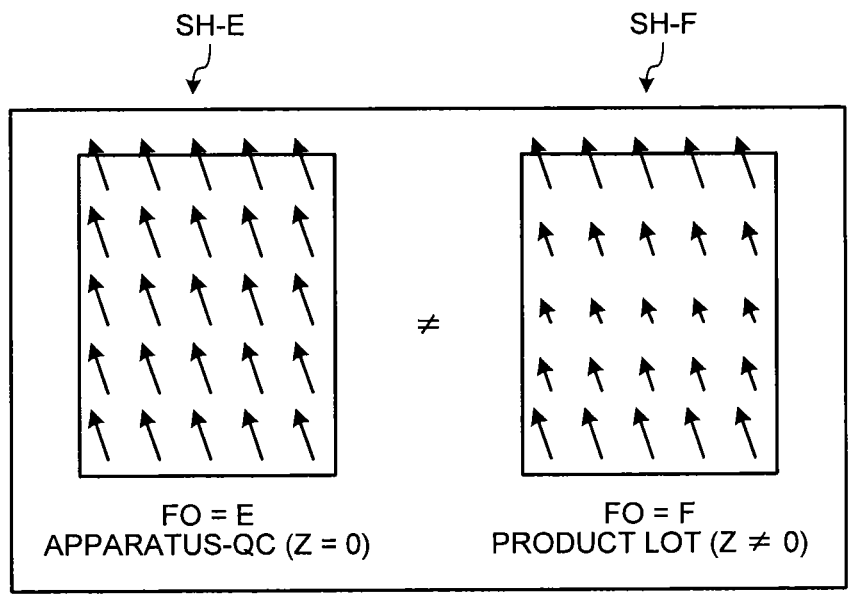
FIG. 4 is a view illustrating measured values representing positional deviation distribution in the first embodiment.

In the embodiment, from the result of reviewing, the focus is on the fact that the best focus position (the focus offset quantity FO=E) of the apparatus, obtained after the exposure apparatus 100 has been subjected to the QC (Quality Control), may be different from the best focus position (the focus offset quantity FO=F) in the actual semiconductor device (product lot), as illustrated in FIG. 4. That is, when obtaining the best focus position of the apparatus, the QC mask pattern (refer to FIG. 5) is transferred onto the flat surface of the substrate. In contrast, for the actual semiconductor device (product lot), a mask pattern is transferred onto the surface of the substrate which is not flat because of the presence of the pattern of a underlying layer. Because of this, both of the best focus positions in the two cases do not always coincident with each other. For this reason, the positional deviation distribution within the shot area widely varies from one semiconductor device to another in the exposing process for the actual semiconductor device, and this problem may appear as a distortion error in the exposure apparatus 100.

For example, assume that the exposure is performed on a product substrate in a Z position with Z≠0 as illustrated on the right side SH-F of FIG. 4 after the QC is performed on the exposure apparatus 100 and a Z position with the focus offset quantity FO=E is set to a reference position with Z=0, that is, as the best focus position, as illustrated on the left side SH-E of FIG. 4. In this case, the distortion error within the shot area appears which does not appear at the time of performing the QC on the exposure apparatus 100, and thus the alignment accuracy within the shot area may decrease at the time of exposing a product wafer.

That is, the transfer position of the pattern of the mask MK on the substrate SB may deviate from the target position, causing pattern defects. For this reason, a rework rate tends to increase, a yield rate of the substrate tends to decrease, or productivity of the semiconductor device may decrease.

To suppress the influence of the distortion error and improve the accuracy in the alignment between the mask MK and the substrate SB, the exposure apparatus 100 measures the respective positional deviation distributions within the shot area for a plurality of focus offset quantities that is different from each other, obtains the distortion errors, and obtains the correlations between the focus offset quantities and the alignment compensation values that are utilized to compensate for distortion errors.

Specifically, the exposure apparatus 100 includes the light source LS, the illumination optical system IOS, the projection optical system POS, a mask stage 10, a substrate stage 20, measuring instruments 40 and 80, and a control system 30.

The light source LS generates, for example, EUV light as exposure light. The light source LS causes the generated exposure light to be incident on the illumination optical system IOS.

The illumination optical system IOS performs an adjustment to the exposure light, for example, using the diaphragm IOSa. The illumination optical system IOS illuminates the mask MK, with the adjusted exposure light. The exposure light incident on the mask MK reflects off the surface MKa of the mask MK, and is guided to the projection optical system POS.

The projection optical system POS further guides the guided exposure light to the surface SBa of the substrate SB.

The mask stage 10 holds the mask MK in place. The mask stage 10 includes, for example, the electrostatic chuck 11, and holds the mask MK in place by adsorbing the mask MK with the electrostatic chuck 11. For example, the mask stage 10 holds, as the mask MK, a QC mask having a QC mask pattern (refer to FIG. 5) corresponding to a plurality of mask alignment marks which has to be formed on the substrate SB at the time of performing the Apparatus-QC. For example, the mask stage 10 holds, as the mask MK, a mask having a mask pattern that corresponds to a pattern of an actual device at the time of performing the process of exposing the actual device.

Furthermore, the mask stage 10 is driven, for example, in 6 directions (X direction, Y direction, Z direction, rotation direction around X axis, rotation direction around Y axis, and rotation direction around Z axis).

The substrate stage 20 holds the substrate SB in place. The substrate stage 20 includes, for example, an electrostatic chuck 21, and holds the substrate SB in place by adsorbing the substrate SB with the electrostatic chuck 21.

Furthermore, the substrate stage 20 is driven, for example, in the 6 directions (X direction, Y direction, Z direction, rotation direction around X axis, rotation direction around Y axis, and rotation direction around Z axis).

The measuring instrument 40 performs the alignment measurement. The measuring instrument 40 includes, for example, an optical microscope. At the time of performing the Apparatus-QC, the measuring instrument 40 obtains an optical image (alignment marks) of a plurality of mask alignment marks PT1 to PTn (refer to FIG. 5) which is formed on the QC substrate SB with the optical microscope, and supplies the result to the control system 30. The measuring instrument 40 may further obtain an optical image of a reference alignment mark M (refer to FIG. 5) with the optical microscope and may supply the result to the control system 30. The QC substrate SB may be, for example, a golden substrate which serves as a reference, or may be a given bare substrate. Furthermore, the alignment measurement may be performed by an external alignment inspection apparatus (not illustrated), independent of the exposure apparatus 100, instead of by the exposure apparatus 100.

The measuring instrument 80 performs a focus measurement. The measuring instrument 80 includes, for example, a projection system 80a and a light-receiving system 80b. The projection system 80a and the light-receiving system 80b, arranged to face each other, are located obliquely above a measurement target object (for example, the substrate SB). Light emitted from the projection system 80a travels along the optical axis to the substrate SB, then forms a given shape of an image on the substrate SB, and reflects off the substrate SB. The reflecting light travels in the direction of being away from the substrate SB along the optical axis and forms a given shape of an image again in the light-receiving system 80b. In this way, the measuring instrument 80 performs the focus measurement to detect a Z position of the substrate SB.

The control system 30 performs control of each part of the exposure apparatus 100. Specifically, the control system 30 includes a mask stage control unit 31, a substrate stage control unit 32, a measurement control unit 33, and a main control unit 34.

The mask stage control unit 31 controls drive of the mask stage 10. The mask stage control unit 31 drives the mask stage 10 to move, for example, in the X direction.

The substrate stage control unit 32 controls drive of the substrate stage 20. The substrate stage control unit 32 drives the substrate stage 20, for example, in the 6 directions (X direction, Y direction, Z direction, rotation direction around X axis, rotation direction around Y axis, and rotation direction around Z axis).

At this point, the main control unit 34 controls the mask stage control unit 31 and the substrate stage control unit 32 to scan the mask stage 10 and the substrate stage 20 along the X direction in a synchronizing manner at the time of performing the exposing operation.

The measurement control unit 33 controls the measuring instrument 40. For example, the measurement control unit 33 controls the measuring instrument 40, and obtains the positional deviation quantities of the plurality of mask alignment marks PT1 to PTn (refer to FIG. 5), using a relative or absolute method.

When using the relative method, the measurement control unit 33 obtains an optical image of the plurality of mask alignment marks PT1 to PTn. The measurement control unit 33 performs a given mathematical operation on the optical image of the plurality of mask alignment marks PT1 to PTn, and thus obtains the positional deviation quantity of each of the mask alignment marks PT1 to PTn.

Figure 5:
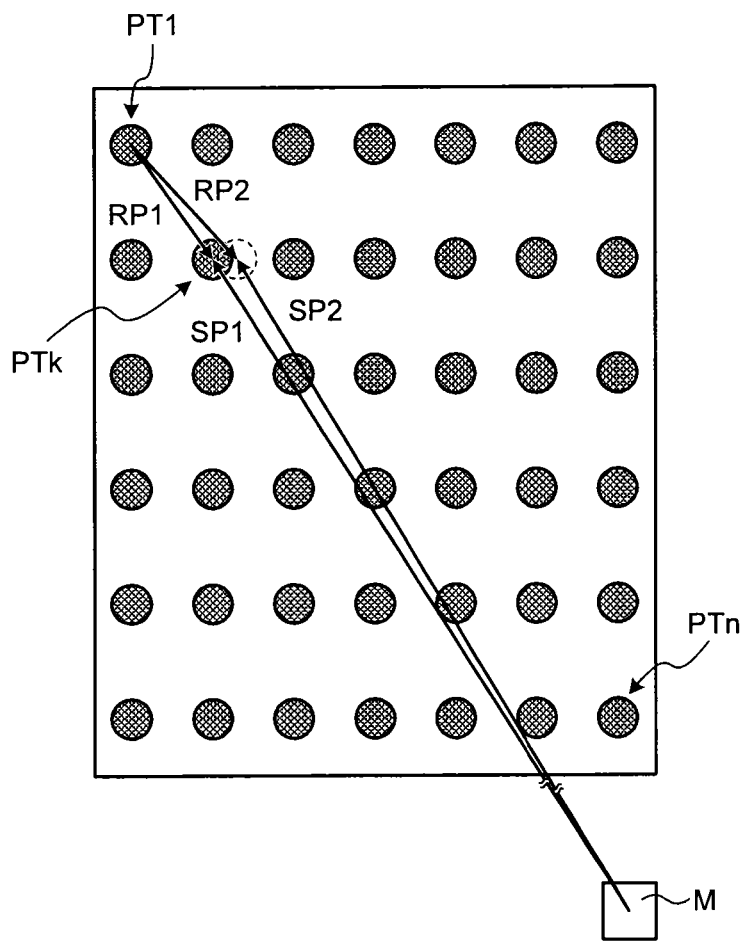
FIG. 5 is a view illustrating a pattern on a QC mask in the first embodiment.

For example, as illustrated in FIG. 5, a relative position vector RP1, which represents an original position of each of the mask alignment mark PTk, is obtained in advance, for example, with the mask alignment mark PT1 being defined as the reference alignment mark. From the obtained optical image, for example, the relative position vector RP2 is obtained which corresponds to a case where the mask alignment mark PTk deviates from the position indicated by a solid line to the position indicated by a dashed line. The positional deviation quantity (for example, vector quantity) is obtained by drawing the relative position vector RP1 from the relative position vector RP2 in terms of vector components. Since this method is performed based on the mask alignment mark PT1, the absolute positional deviation quantity may not be obtained, but the relative positional deviation between the plurality of mask alignment marks PT1 to PTn may be obtained.

Otherwise, in the case of using the absolute method, the measurement control unit 33 obtains the optical image of the plurality of mask alignment marks PT1 to PTn and the optical image of the reference alignment mark M. The measurement control unit 33 performs a given mathematical operation on the optical image of the plurality of mask alignment marks PT1 to PTn, using the optical image of the reference alignment mark M, and thus obtains the positional deviation quantity of each of the mask alignment marks PT1 to PTn.

For example, as illustrated in FIG. 5, the absolute position vector SP1 that represents the original position of the mask alignment mark PTk is obtained in advance, based on, for example, the reference alignment mark M. And, from the obtained optical image, the absolute position vector SP2 is obtained, for example, for a case where the mask alignment mark PTk deviates from the position indicated by a solid line to the position indicated by a dashed line. The positional deviation quantity (for example, vector quantity) is obtained by drawing the absolute position vector SP1 from the absolute position vector SP2 in terms of vector components. Since this method is performed based on the reference alignment mark M, the absolute positional deviation quantity of each of the mask alignment marks PT1 to PTn may be also obtained.

The measurement control unit 33 obtains two-dimensional distribution information (refer to FIG. 7) on the obtained positional deviation quantities (for example, vector quantities) as the measured values that represent the positional deviation distribution within the shot area. The measurement control unit 33 obtains the measured values like this for the plurality of focus offset quantities that are different from each other, for example, sequentially. The measurement control unit 33 supplies the obtained measured values to the main control unit 34. The measurement control unit 33 sequentially supplies, for example, the plurality of measured values (for example, refer to sections SH-A, SH-B, and SH-C of FIG. 7) to the main control unit 34.

Furthermore, the measurement control unit 33 controls the measuring instrument 80. For example, the measurement control unit 33 controls the measuring instrument 80 so that focus measurement is performed and the result of the focus measurement is obtained. Then, the measurement control unit 33 obtains the focus offset quantity FO, using things such as a difference between the result of the focus measurement and the Z position serving as a reference, based on the result of the focus measurement. The measurement control unit 33 supplies the obtained focus offset quantities FO, as the measured values, to the main control unit 34.

The main control unit 34 controls the mask stage control unit 31, the substrate stage control unit 32, and the measurement control unit 33 in an overall manner. Specifically, the main control unit 34 includes a focus control unit 35, an alignment control unit 36, a storage unit 37, and an exposing process unit 38.

The focus control unit 35 receives the measured values obtained through the focus measurement, that is, the focus offset quantity FO, from the measurement control unit 33. The focus control unit 35 compares the focus offset quantity FO with a target focus offset quantity.

For example, the focus control unit 35 includes a first determination unit 35a that determines the target focus offset quantity. The first determination unit 35a, for example, determines, as the target focus offset quantity, the focus offset quantity that is not selected from among the plurality of focus offset quantities that are different from each other when performing the Apparatus-QC. The first determination unit 35a, for example, determines, as the target focus offset quantity, the focus offset quantity that corresponds to manufacturing requirements for the actual device based on recipe information on the actual device when exposing the substrate of the actual device.

The focus control unit 35 obtains the focus compensation value that puts the focus offset quantity FO close to the target focus offset quantity. The focus control unit 35 causes the substrate stage control unit 32 to move the substrate SB, for example, in the Z direction, using the obtained focus compensation value.

The alignment control unit 36 includes a calculation unit 36a and a second determination unit 36b. The calculation unit 36a includes an error calculation unit 36a1 and a correlation calculation unit 36a2.

The error calculation unit 36a1 receives the plurality of measured values that represents the positional deviation distribution within the shot area, for example, sequentially, from the measurement control unit 33. The error calculation unit 36a1 obtains the distortion error that represents distortion in the positional deviation distribution, for each of the plurality of measured values. For example, the error calculation unit 36a1 calculates the distortion error (for example, vector quantity) by simply adding up the plurality of positional deviation quantities (for example, vector quantities) included in the respective measured values, in terms of vector components. The error calculation unit 36a1 supplies the obtained distortion error to the correlation calculation unit 36a2.

The correlation calculation unit 36a2, for example, receives the measured value obtained through the focus measurement, that is, the focus offset quantity FO, from the measurement control unit 33, and receives the distortion error from the error calculation unit 36a1, each time the focus offset quantity FO changes when performing the Apparatus-QC. That is, the correlation calculation unit 36a2 receives the plurality of focus offset quantities and the plurality of distortion errors, in the form that enables correspondence between the focus offset quantity and the distortion error to be obtainable. The correlation calculation unit 36a2 obtains the correlation between the focus offset quantity and the alignment compensation value, in response to the plurality of focus offset quantities and the plurality of distortion errors. The alignment compensation value is a compensation value for compensating for the distortion error.

For example, the correlation calculation unit 36a2 obtains a vector (Dx, Dy) that cancels the distortion error when receiving the distortion error (for example, vector quantity). The correlation calculation unit 36a2 calculates, for example, each of coefficients $K_1$ to $K_{20}$ that correspond to that vector, as the alignment compensation value. The correlation calculation unit 36a2 repeatedly performs this operation on the plurality of focus offset quantities FO=A to C which is different from each other, and thus calculates the correlations $G_1$ to $G_{20}$ for the plurality of alignment compensation values $K_1$ to $K_{20}$ (refer to FIG. 8B). The correlation calculation unit 36a2 stores correlation information that corresponds to the obtained correlations $G_1$ to $G_{20}$, in the storage unit 37.

The second determination unit 36b obtains the correlation information that corresponds to the correlation, referring to the storage unit 37. Furthermore, the second determination unit 36b receives from the first determination unit 35a the focus offset quantity which is determined to be the target focus offset quantity at the time of exposing the substrate of the actual device. The second determination unit 36b determines the alignment compensation value for the focus offset quantity of the substrate of the actual device, in response to the correlation information. The second determination unit 36b supplies the determined alignment compensation value to the exposing process unit 38.

The exposing process unit 38 is controlled such that the substrate stage 20 moves the substrate SB in the Z direction, in response to the focus offset quantity FO determined by the first determination unit 35a, and then the substrate SB is exposed in the moved position, at the time of performing the Apparatus-QC.

Furthermore, the exposing process unit 38 exposes the substrate SB, using the determined focus offset quantity FO and alignment compensation value, at the time of exposing the actual device. That is, the exposing process unit 38 causes the substrate stage 20 to move the substrate SB in the Z direction, in response to the focus offset quantity FO that is determined by the first determination unit 35a, and then causes the substrate stage 20 to move the substrate SB in the X and Y directions, in response to the alignment compensation value that is determined by the second determination unit 36b, and then controls the substrate SB to be exposed in the moved position.

The storage unit 37 stores the correlation information that is in response to the correlation that is obtained by the correlation calculation unit 36a2.

At this point, when an amount of data on the obtained correlations $G_1$ to $G_{20}$ is large, the storage unit 37, accordingly, has to be large in storage capability to store such a large amount of data. Accordingly, it is desired to reduce the amount of data to reduce the cost of the exposure apparatus 100.

Figure 9:
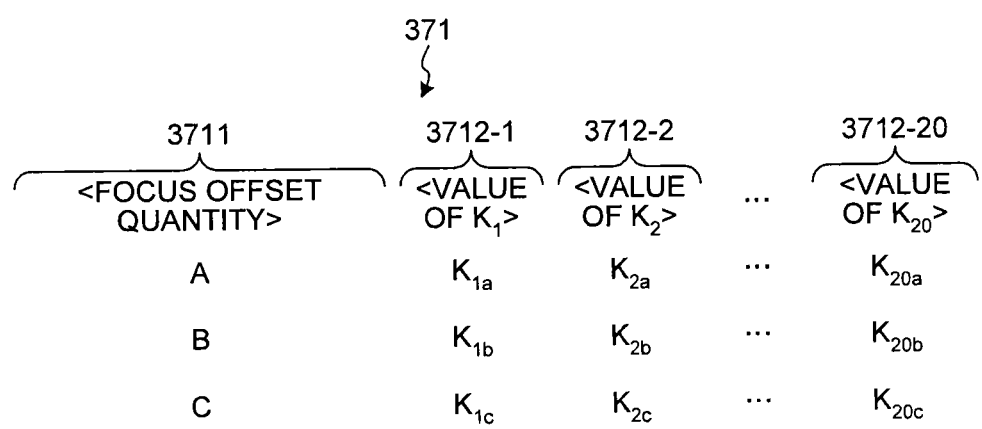
FIG. 9 is a view illustrating a data structure of a correlation table in the first embodiment.

For example, the correlation calculation unit 36a2 extracts the values corresponding to the focus offset quantities A, B, and C, which are supposed to be used in the actual device, from the obtained correlations $G_1$ to $G_m$, and for example, generates a correlation table 371, as illustrated in FIG. 9. The correlation table 371 contains, for example, a focus offset column 3711, a $K_1$ value column 3712-1, a $K_2$ value column 3712-2, . . . , and a $K_{20}$ value column 3712-20. By referring to the correlation table 371, for example, $K_{1a}$ to $K_{20a}$ may be specified, as the alignment compensation values which correspond to the focus offset quantity A. By referring to the correlation table 371, for example, $K_{1b}$ to $K_{20b}$, may be specified, as the alignment compensation values which correspond to the focus offset quantity B. By referring to the correlation table 371, for example, $K_{1c}$ to $K_{20c}$ may be specified, as the alignment compensation values that correspond to the focus offset quantity C. The correlation calculation unit 36a2 causes the generated correlation table 371 to be stored in the storage unit 37.

Otherwise, for example, the correlation calculation unit 36a2 obtains function formulas representing the relations between the focus offset quantity and the alignment compensation value, from the obtained correlations $G_1$ to $G_{20}$. That is, the correlation calculation unit 36a2 obtains function formulas $K_1=F_1(FO)$, $K_2=F_2(FO)$, . . . , and $K_{20}=F_{20}(FO)$ for obtaining the alignment compensation values $K_{1b}$ to $K_{2b}$ from the focus offset quantity FO. For example, when the relations between the focus offset quantity FO and the alignment compensation values $K_{1b}$ to $K_{20b}$ for the apparatus AP2 are plotted in a substantially straight line, as illustrated in FIG. 8B, a linear function may be used as functions $F_1$ to $F_{20}$. Otherwise, for example, when the relations between the focus offset quantity FO and the alignment compensation values $K_{1b}$ to $K_{20b}$ are plotted as similarly as a quadratic function, a quadratic function may be used as functions $F_1$ to $F_{20}$. Otherwise, for example, when the relationships between the focus offset quantity FO and the alignment compensation values $K_{1b}$ to $K_{20b}$ are plotted as similarly as a cubic function, a cubic function may be used as functions $F_1$ to $F_{20}$. Otherwise, for example, when the relations between the focus offset quantity FO and the alignment compensation values $K_{1b}$ to $K_{20b}$ are plotted as similarly as an n-th (n≥4) function, an n-th function may be used as the functions $F_1$ to $F_{20}$. The correlation calculation unit 36a2 causes the obtained function formulas to be stored in the storage unit 37.

Figure 10:
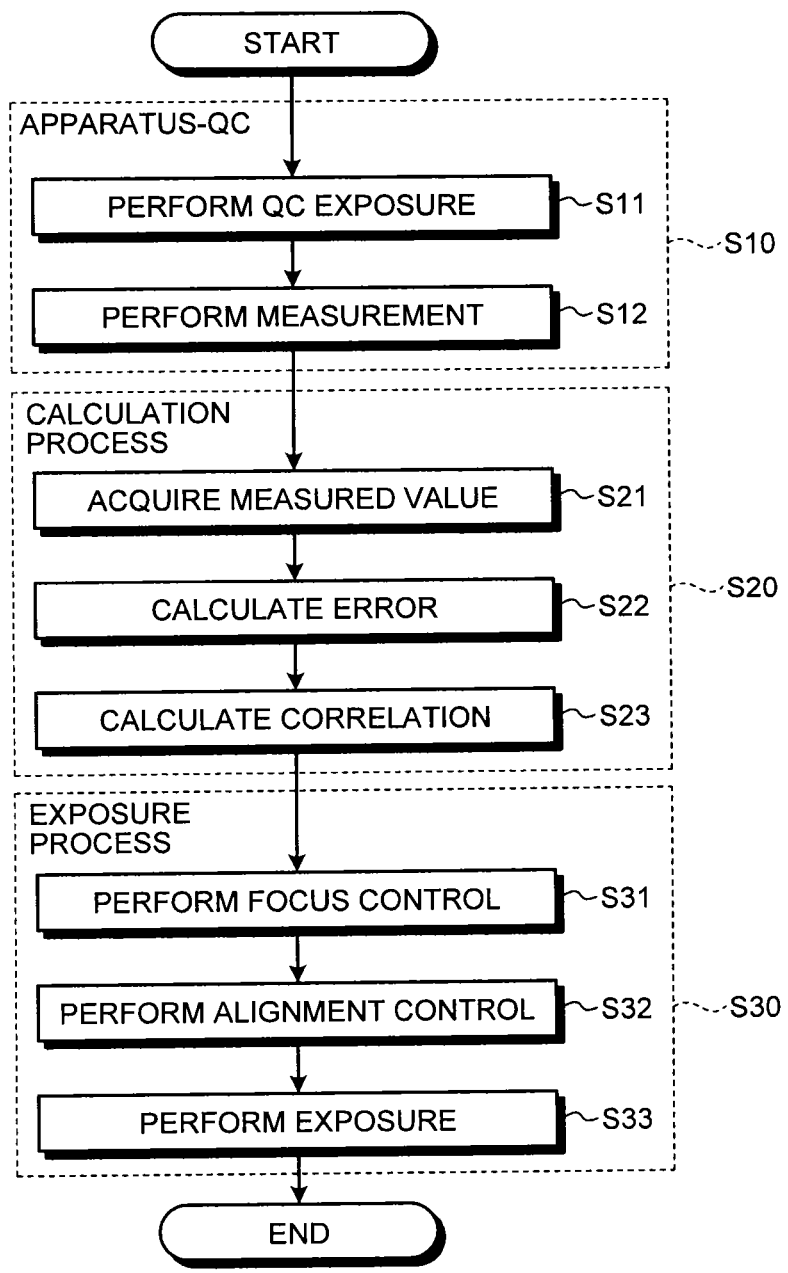
FIG. 10 is a flowchart illustrating operation of the exposure apparatus according to the first embodiment.

Next, operation of the exposure apparatus 100 is described, mainly referring to FIG. 10. FIG. 10 is a flowchart illustrating the operation of the exposure apparatus 100.

At Step S10, the exposure apparatus 100 performs Apparatus-QC. Specifically, the processes of the following Step S11 and Step S12 are performed.

At Step S11, the exposure apparatus 100 performs a QC exposure.

Specifically, an alignment QC mask MK for the exposure apparatus is prepared which has a mask pattern as illustrated in FIG. 5. The alignment QC mask MK for the exposure apparatus has a pattern of a plurality of mask alignment marks PT1 to PTn arranged in a shot area (exposable area) as illustrated in FIG. 5, and can measure a distortion component (distortion error) within the shot area.

The exposure apparatus 100 performs an exposure on the alignment QC substrate SB and thus forms the plurality of alignment marks, using the alignment QC mask MK. The QC substrate SB may be, for example, a golden substrate which serves as a reference, or may be a given bare substrate.

Figure 6:
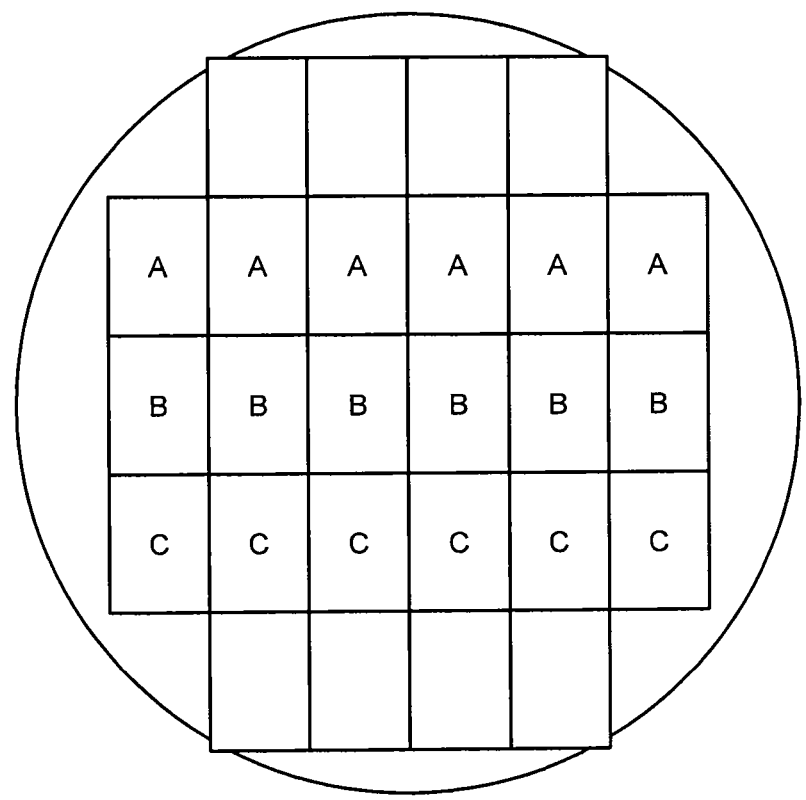
FIG. 6 is a view illustrating a pattern on a QC substrate in the first embodiment.

At this point, conventional alignment QC exposure is performed, with the focus offset quantity being fixed (subject to zero or 1), but in the embodiment, the exposure is sequentially performed, for example, under a plurality of conditions of focus offsets. For example, as illustrated in FIG. 6, the QC exposure is performed on each of the plurality of shot areas marked "A" under the condition of the focus offset quantity FO=A, then performs the QC exposure on each of the plurality of shot areas marked "B" under the condition of the focus offset quantity FO=B, and then performs the QC exposure on each of the plurality of shot areas marked "C" under the condition of the focus offset quantity FO=C.

At Step S12, the exposure apparatus 100 performs the alignment measurement. That is, the exposure apparatus 100 performs the alignment measurement on the QC substrate SB that is exposed under the plurality of focus offset conditions (focus offset quantities FO=A to C). The alignment measurement is a measurement of the mask alignment marks that are arranged within the shot areas. The reference alignment mark may be additionally measured which is formed independently of the mask alignment marks. To perform the high-precision alignment measurement, in a case illustrated in FIG. 6, the alignment measurement may be performed for a plurality of shot areas, each for every focus offset quantity, and a value obtained by averaging measurement results for the plurality of shot areas may be determined as a measurement result for such a focus offset quantity.

Furthermore, the alignment measurement may be performed by an external alignment inspection apparatus (not illustrated), independent of the exposure apparatus 100, instead of by the exposure apparatus 100.

At Step S20, the exposure apparatus 100 performs a calculation process. Specifically, the processes of the following Steps S21 to S23 are performed.

At Step S21, the exposure apparatus 100 obtains the positional deviation quantities of the plurality of mask alignment marks, using the relative or absolute method described above. The measurement control unit 33 obtains two-dimensional distribution information (refer to FIG. 7) on the obtained positional deviation quantity (for example, vector quantity) as the measured value that represents the positional deviation distribution within the shot area. That is, each of the measured values represents the positional deviation distribution within the shot area, and thus, for example, includes two-dimensional distribution information (refer to FIG. 7) on the positional deviation quantity (for example, vector quantity) within the shot area.

Figure 7:
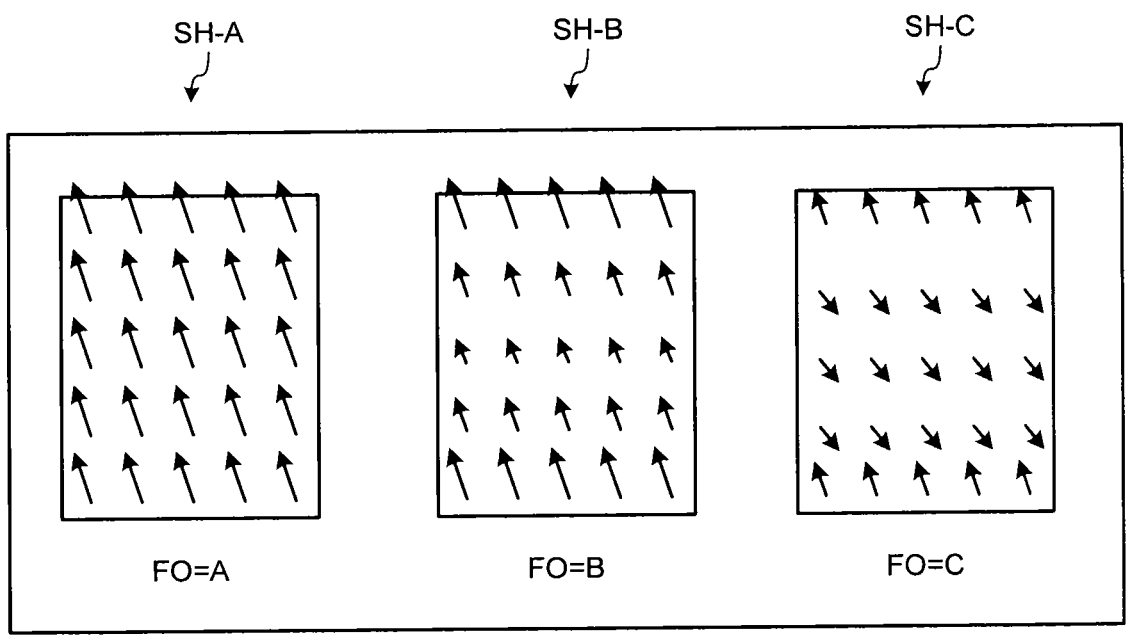
FIG. 7 is a view illustrating the plurality of measured values representing positional deviation distribution in the first embodiment.

At Step S22, the exposure apparatus 100 calculates the distortion component (distortion error) within the shot area from each of the measured values, for every focus offset quantity (refer to FIG. 7). For example, the exposure apparatus 100 simply adds up the plurality of positional deviation quantities (for example, vector quantities) that are included in the respective measured values, in terms of vector components, and thus obtains the distortion error (for example, vector quantity).

At Step S23, the exposure apparatus 100 obtains the correlation between the focus offset quantity and the alignment compensation value, in response to the plurality of focus offset quantities and the plurality of distortion errors. For example, the exposure apparatus 100 performs least square approximation on a calculation result of Step S22, for example, by a cubic function formula, which is a high-order function formula, as illustrated in FIG. 8A, and thus calculates the alignment compensation values $K_1$ to $K_{20}$ to compensate for the distortion error for every focus offset quantity.

Specifically, the exposure apparatus 100, when receiving the distortion error (for example, vector quantity), obtains a vector (Dx, Dy) that cancels the distortion error. The correlation calculation unit 36a2 performs, for example, least square approximation, by a cubic function formula as a high-order function formula as illustrated in FIG. 8A, and thus obtains the coefficients $K_1$ to $K_{20}$ that are in response to such the vector, as the alignment compensation values. The correlation calculation unit 36a2 repeatedly performs this process on the plurality of focus offset quantities FO=A to C which are different from each other, and thus obtain the correlations $G_1$ to $G_{20}$ respectively for the plurality of alignment compensation values $K_1$ to $K_{20}$ (refer to FIG. 8B). The exposure apparatus 100 generates the correlation information that is in response to the obtained correlations $G_1$ to $G_{20}$ and causes such correlation information to be stored in the storage unit 37.

At Step S30, the exposure apparatus 100 performs the exposure process on the substrate SB of the actual device. Specifically, the processes of the following Steps S31 to S33 are performed.

At Step S31, the exposure apparatus 100 performs a focus control. For example, the exposure apparatus 100 determines the focus offset quantity that is in response to the manufacturing condition of the actual device, based on, for example, the recipe information on the actual device. The exposure apparatus 100 moves the substrate SB, for example, in the Z direction, in such a manner to be close to the determined focus offset quantity.

At Step S32, the exposure apparatus 100 performs an alignment control. That is, the exposure apparatus 100 uses the information like the alignment compensation values $K_1$ to $K_{20}$ for each of the calculated focus offset quantities, that is, the correlation information (for example, the correlation table 371 as illustrated in FIG. 9), and thus compensates for the distortion component (distortion error) within the shot area, using the alignment compensation values $K_1$ to $K_{20}$ that are in response to the focus offset quantity of the product that is actually exposed.

Specifically, the exposure apparatus 100 acquires the correlation information that is in response to the correlation, referring to the storage unit 37. The exposure apparatus 100 determines the alignment compensation values $K_1$ to $K_{20}$ for the focus offset quantity of the substrate of the actual device, in response to the correlation information. The exposure apparatus 100 determines, for example, an amount of movement in the X and Y directions from function formulas as illustrated in FIG. 8, in response to the determined alignment compensation values $K_1$ to $K_{20}$, and then moves the substrate SB in the X and Y directions.

At Step S33, the exposure apparatus 100 performs the exposure on the substrate SB.

As described above, in the first embodiment, in the exposure apparatus 100, the measurement control unit 33 obtains the plurality of measured values that is measured for the plurality of focus offset quantities that are different from each other and that represents the positional deviation distribution within the shot areas. The calculation unit 36a obtains the plurality of distortion errors from the plurality of measured values, and obtains the correlation between the focus offset quantity and the alignment compensation value, in response to the plurality of focus offset quantities and the plurality of distortion errors. Because of this, when the focus offset quantity varies from semiconductor device to semiconductor device, the alignment compensation value for compensating for the distortion error may be adjusted. Therefore, the distortion error may be compensated for to improve the alignment accuracy within the shot area, when the distortion error appears because the best focus position of the actual device deviates from the best focus position that is defined at the time of performing the Apparatus-QC.

Furthermore, in the first embodiment, in the exposure apparatus 100, the first determination unit 35a determines the focus offset quantity at the time of exposing the substrate of the actual device, the second determination unit 36b determines the alignment compensation value for the focus offset quantity of the actual device in response to the correlation obtained by the calculation unit 36a, and the exposing process unit 38 exposes the substrate SB, using the determined alignment compensation value. This improves the alignment accuracy within the shot area at the time of exposing the actual device, so that occurrence of the defective pattern may be suppressed, the rework rate may be reduced, and the substrate yield may be improved. As a result, the productivity of the semiconductor device may be improved.

Furthermore, in the first embodiment, the calculation unit 36a obtains the correlation table 371, in which the focus offset quantity and the alignment compensation value are associated with each other with respect to the plurality of focus offset quantities, in response to the plurality of focus offset quantities and the plurality of distortion errors. Because of this, the correlation table 371 is referred to, and thus the alignment compensation value for the focus offset quantity may be easily determined. Furthermore, an amount of data, which is referred to in determining the alignment compensation value for the focus offset quantity, may be suppressed to be lesser.

Furthermore, in the first embodiment, the calculation unit 36a obtains the function formulas representing the relation between the focus offset quantity and the alignment compensation value, in response to the plurality of focus offset quantities and the plurality of distortion errors. Because of this, the calculation is performed by substitution in the function formula, and the alignment compensation value may be easily determined for the focus offset quantity. Furthermore, an amount of data, which is referred to in determining the alignment compensation value for the focus offset quantity, may be suppressed to be lesser.

Furthermore, the first embodiment is described, by way of example, in connection with the case in which the calculation of the correlation is performed in the exposure apparatus, but the calculation of the correlation may be performed outside the exposure apparatus. For example, the obtained correlation information may be input to the exposure apparatus by any of the following methods: a direct input method; a method of using a storage medium; and a method of transmitting data online.

Figure 11:
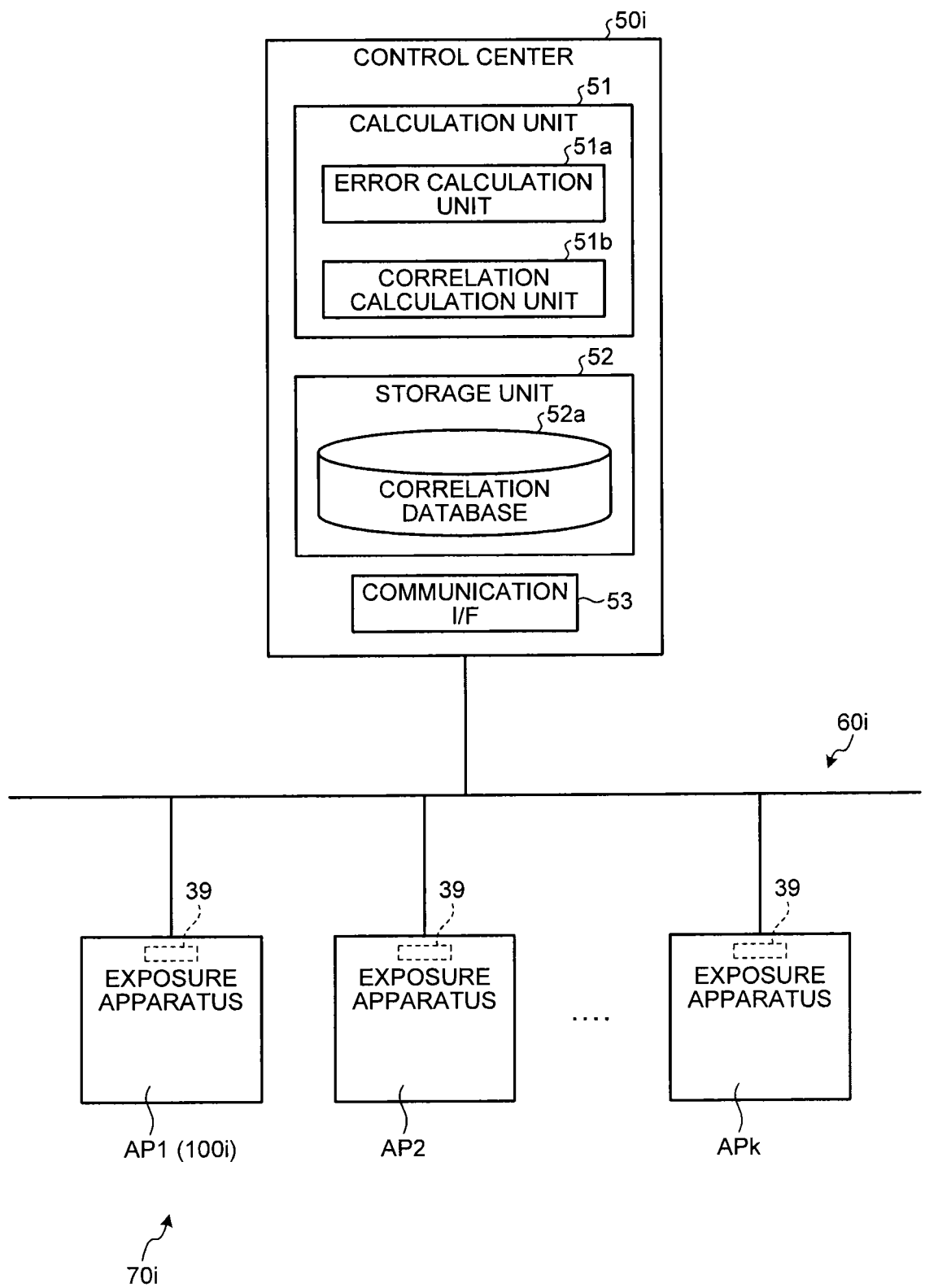
FIG. 11 is a view illustrating a configuration of a system including the exposure apparatus according to a modification of the first embodiment.

For example, as illustrated in FIG. 11, the calculation of the correlation may be performed in a control center 50i. FIG. 11 is a view illustrating a configuration of a system including the exposure apparatus according to a modification of the first embodiment. In this case, in an exposure control system 70i, the control center 50i may make a connection to a plurality of exposure apparatuses 100 AP1, AP2, . . . , and APk (exposure apparatus 100i) over a communication line 60i, and integrally controls the exposure apparatuses AP1 to APk to calculate correlation for each of the exposure apparatuses AP1 to APk in a lump (refer to FIG. 8B).

Specifically, the control center 50i includes a calculation unit 51, a storage unit 52, and a communication I/F 53. The calculation unit 51 includes an error calculation unit 51a and a correlation calculation unit 51b. Functions of the error calculation unit 51a and the correlation calculation unit 51b are the same as the error calculation unit 36a1 and the correlation calculation unit 36a2 in each of the exposure apparatuses 100 (refer to FIG. 1), respectively. In addition, each of the exposure apparatuses AP1 to APk may have a configuration in which the calculation unit 36a (refer to FIG. 1) is not included.

A correlation database 52a is stored in the storage unit 52 of the control center 50i. For example, as illustrated in FIG. 12, the correlation database 52a has a data structure to which apparatus identifiers are added for correspondence with the apparatuses, based on the same data structure as the correlation table 371 (refer to FIG. 9) in the exposure apparatus 100 (refer to FIG. 1). That is, the correlation database 52a includes, for example, an apparatus identifier column 52a3, a focus offset column 52a1, and a $K_1$ value column 52a2-1, a $K_2$ value column 52a2-2, . . . , and a $K_{20}$ value column 52a2-20. For example, by referring to the correlation database 52a, $K_{1a}$ to $K_{20a}$ may be determined in the correlation database 52a, as the alignment compensation values that correspond to the focus offset quantity A of the exposure apparatus AP1. For example, by referring to the correlation database 52a, $K_{1ck}$ to $K_{20ck}$ may be determined as the alignment compensation values that correspond to the focus offset quantity C of the exposure apparatus APk.

The communication I/F 53 of the control center 50i is an interface for communication with the plurality of exposure apparatuses AP1 to APk over the communication line 60i. For this purpose, each of the exposure apparatuses AP1 to APk may have a configuration in which a communication I/F 39 is additionally provided in its control system. The communication I/F 39 is an interface for communication with the control center 50i and is connected to the communication line 60i.

For example, each of the exposure apparatuses AP1 to APk obtains a plurality of measured values that represents positional deviation distribution within a shot area, and stores them in its storage unit. For example, the control center 50i periodically has access to the storage unit of each of the exposure apparatuses AP1 to APk over the communication line 60i and receives a plurality of focus offset quantities, the plurality of measured values representing the positional deviation distribution within the shot area, and identification information on the exposure apparatus, from each of the exposure apparatuses AP1 to APk through the communication I/F 53 over the communication line 60i. The error calculation unit 51a of the calculation unit 51 receives the plurality of measured values through the communication I/F 53, obtains the plurality of distortion errors from the plurality of measured values, and supplies the plurality of distortion errors to the correlation calculation unit 51b. The correlation calculation unit 51b receives the plurality of focus offset quantities through the communication I/F 53, receives the plurality of distortion errors from the error calculation unit 51a, obtains the correlation between the focus offset quantity and the alignment compensation value, in response to the plurality of focus offset quantities and the plurality of distortion errors, and generates correlation information that is in response to the obtained correlation as well. The correlation calculation unit 51b receives the identification information on the exposure apparatuses AP1 to APk through the communication I/F 53, causes the generated correlation information to be associated with the identification information on the exposure apparatuses AP1 to APk, and stores the result as, for example, the correlation database 52a (refer to FIG. 12) in the storage unit 52. The control center 50i, when receiving an acquisition request for the correlation from the exposure apparatuses AP1 to APk over the communication line 60i, reads out the corresponding correlation information on the exposure apparatus from the storage unit 52, and transmits the read information to the exposure apparatuses AP1 to APk over the communication line 60i. In this way, the plurality of measured values is updated with the latest ones in each of the exposure apparatuses AP1 to APk, and the latest measured values are stored in each of the exposure apparatuses AP1 to APk, and thus the latest correlation information may be obtained, with proper timing.

Second Embodiment

Next, an exposure apparatus according to a second embodiment is described. Mainly what distinguishes the second embodiment from the first embodiment is described below.

Figure 13:
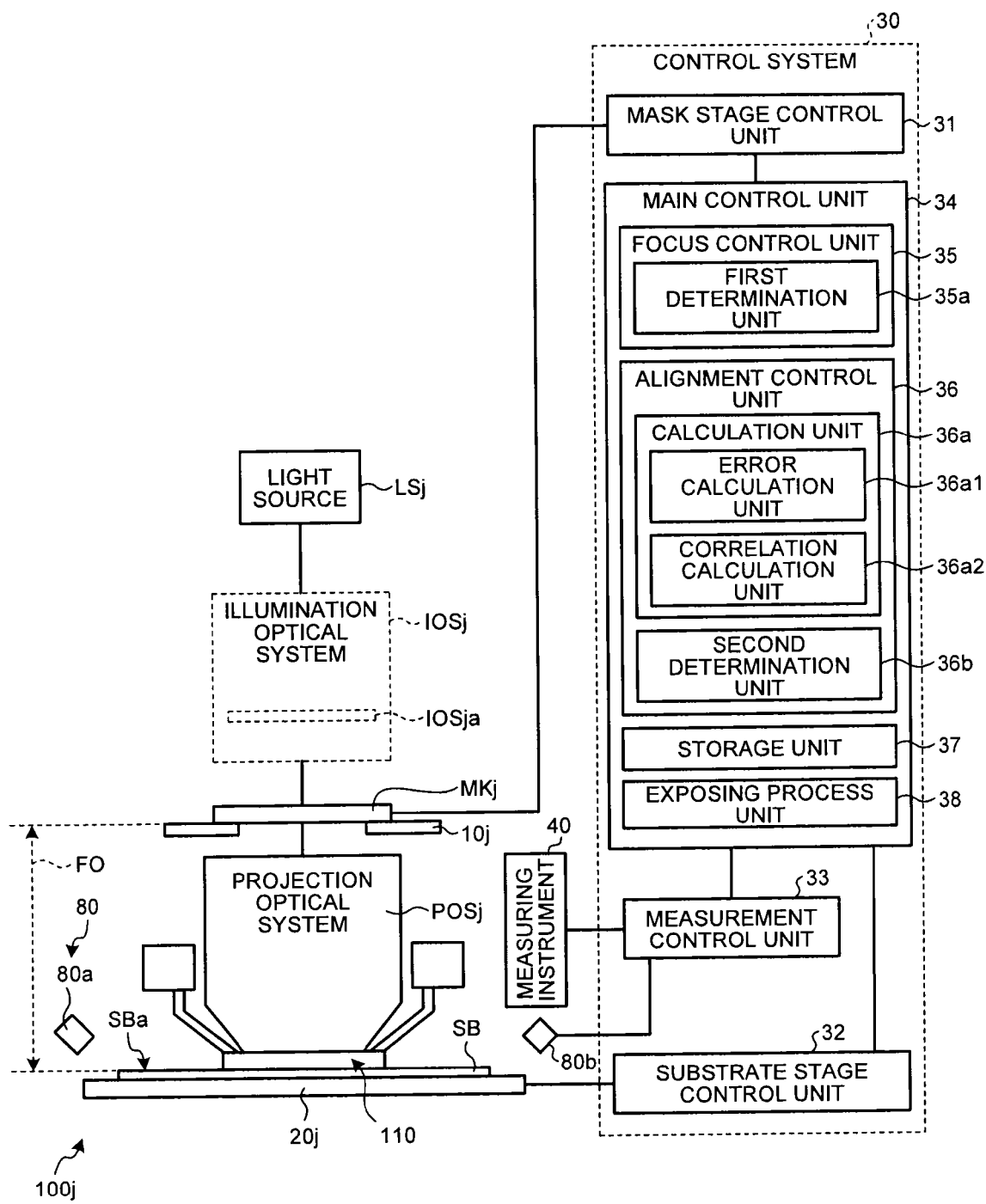
FIG. 13 is a view illustrating a configuration of an exposure apparatus according to a second embodiment.
Figure 14A:
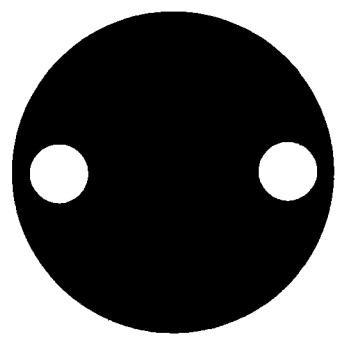
FIGS. 14A and 14B are views illustrating a configuration of a diaphragm in the second embodiment.
Figure 14B:
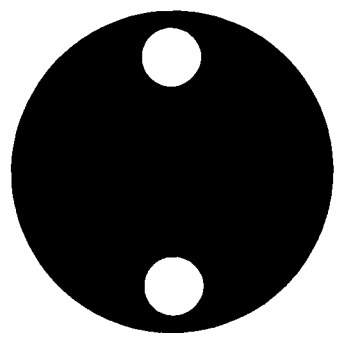

FIG. 13 illustrates a configuration of an exposure apparatus 100j according to the second embodiment. The exposure apparatus 100j is an immersion exposure apparatus in which a light source LSi generates, for example, ArF light. Accordingly, an illumination optical system IOSj and a projection optical system POSj are both a refracting optical system. In the configuration, a gap between a substrate SB held by a substrate stage 20j and the projection optical system POS is filled with water supplied by a water supply/recovery mechanism 110. A mask MKj held by a mask stage 10j is a transmissive mask. Even in this immersion exposure apparatus, when the shape of the aperture of a diaphragm IOSja arranged in the pupil position of the illumination optical system IOSj is controlled such that dipole illumination can be used as illustrated in FIGS. 14A and 14B, even though exposure light is non-telecentric with respect to the mask MKj, the telecentric slippage may occur also in the immersion exposure apparatus under influence of the illumination brightness distribution. Because of this, a positional deviation error that a transfer position of an exposure pattern on the substrate SB deviates in the direction along a surface SBa of the substrate SB may occur.

Also in the second embodiment, to suppress the influence of the distortion error and improve the accuracy in the alignment of the mask MKj and the substrate SB, the exposure apparatus 100j measures the positional deviation distribution within the shot areas for a plurality of focus offset quantities that are different from each other, obtains the distortion error, and obtains the correlation between the focus offset quantity and the alignment compensation value that is utilized to compensate for the distortion error. That is, the exposure apparatus 100j includes the same control system 30 as the first embodiment.

In this way, in the second embodiment, in the exposure apparatus 100j, the measurement control unit 33 obtains the plurality of measured values that is measured for the plurality of focus offset quantities that are different from each other and that represents the positional deviation distribution within the shot area. A calculation unit 36a obtains a plurality of distortion errors from the plurality of measured values, and obtains the correlation between the focus offset quantity and the alignment compensation value, in response to the plurality of focus offset quantities and the plurality of distortion errors. That is, also in the second embodiment, when the focus offset quantity varies from semiconductor device to semiconductor device, the alignment compensation value may be adjusted for compensating for the distortion error. As a result, the distortion error may be compensated for to improve the alignment accuracy within the shot area when there is a concern the distortion error appears because the best focus position of the actual device deviates from the best focus position that is defined at the time of performing the Apparatus-QC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An exposure apparatus comprising:
an acquisition unit which repeats an acquisition operation to obtain measured values of a plurality of alignment marks arranged on a first substrate while changing a first focus offset quantity for the first substrate, thereby to obtain plural sets of measured values that are measured for a plurality of first focus offset quantities different from each other, each set of measured values representing positional deviation distribution within a shot area;
a calculation unit which calculates a plurality of distortion errors from the plural sets of measured values and which correlates a focus offset quantity to an alignment compensation value to compensate for the distortion error with respect for a plurality of focus offset quantities, in response to the obtained plurality of first focus offset quantities and the calculated plurality of distortion errors;
a first determination unit that determines a target focus offset quantity when exposing a second substrate;

a second determination unit that determines an alignment compensation value for the determined target focus offset quantity, in response to the obtained correlation; and a control unit which controls a second focus offset quantity of the second substrate to reach the target focus offset quantity determined by the first determination unit, and which controls a planar position of the second substrate to reach a planar position corresponding to the alignment compensation value determined by the second determination unit.

2. The exposure apparatus according to claim 1, wherein the distortion error is an error that represents distortion in positional deviation distribution.

3. The exposure apparatus according to claim 2, wherein the calculation unit calculates the distortion error by vectorially simply adding up a plurality of positional deviation quantities that is included in each set of measured values.

4. The exposure apparatus according to claim 3, wherein the calculation unit performs a calculation operation which obtains a vector to cancel the calculated distortion error and which obtains a plurality of coefficients corresponding to the obtained vector, as the alignment compensation value.

5. The exposure apparatus according to claim 4, wherein the calculation unit obtains the correlation for the plurality of coefficients by repeatedly performing the calculation operation on the plurality of first focus offset quantities.

6. The exposure apparatus according to claim 1, wherein the calculation unit further obtains correlation information that is in response to the obtained correlation.

7. The exposure apparatus according to claim 6, wherein the calculation unit obtains a correlation table in which the focus offset quantity and the alignment compensation value are associated with each other, with respect to the plurality of focus offset quantities, in response to the plurality of first focus offset quantities and the plurality of distortion errors.

8. The exposure apparatus according to claim 7, further comprising:
a storage unit which stores the obtained correlation table.

9. The exposure apparatus according to claim 7, wherein the calculation unit obtains a correlation in which the focus offset quantity and the alignment compensation value are associated with each other, with respect to the plurality of focus offset quantities, in response to the plurality of first focus offset quantities and the plurality of distortion errors, extracts values that are in response to the plurality of focus offset quantities that is supposed to be used in an actual device, from the obtained correlation, and obtains the correlation table in which the focus offset quantity and the alignment compensation value are associated with each other, with respect to the plurality of focus offset quantities supposed to be used in the actual device.

10. The exposure apparatus according to claim 6, wherein the calculation unit obtains a function formula representing a relation between the focus offset quantity and the alignment compensation value, in response to the plurality of first focus offset quantities and the plurality of distortion errors.

11. The exposure apparatus according to claim 10, further comprising:
a storage unit which stores the obtained function formula.

12. The exposure apparatus according to claim 10, wherein the calculation unit obtains a correlation in which the focus offset quantity and the alignment compensation value are associated with each other, with respect to the plurality of first focus offset quantities, in response to the plurality of focus offset quantities and the plurality of distortion errors, and obtains the function formula from the obtained correlation.

13. The exposure apparatus according to claim 1, further comprising:
a first measurement unit that acquires optical image of the plurality of alignment marks arranged on the first substrate; and
a second measurement unit that performs a focus measurement with respect to the first substrate and the second substrate; and wherein
the acquisition unit obtains the plural sets of measured values with respect to the plurality of first focus offset quantities, in response to the optical image of the plurality of alignment marks acquired by the first determination measurement unit and the plurality of first focus offset quantities measured by the second measurement unit, and
the control unit exposes the second substrate, in a state where the control unit controls both the second focus offset quantity and the planar position of the second substrate.

14. The exposure apparatus according to claim 1, wherein the exposure apparatus is an EUV exposure apparatus.

15. The exposure apparatus according to claim 1, wherein the exposure apparatus is an immersion exposure apparatus.

16. An exposure control system comprising:
a plurality of exposure apparatuses; and
a control center connected to the plurality of exposure apparatus via a communication line, wherein
each of the exposure apparatuses includes:
an acquisition unit which repeats an acquisition operation to obtain measured values of a plurality of alignment marks arranged on a first substrate while changing a first focus offset quantity for the first substrate, and obtain plural sets of measured values that are measured for a plurality of first focus offset quantities different from each other, each set of measured values representing positional deviation distribution within a shot area;
a storage unit which stores the obtained plural sets of measured values, and wherein
the control center includes:
a receiving unit which accesses to the storage unit of each of the exposure apparatuses via the communication line to receive the stored plural sets of measured values; and
a calculation unit which calculates a plurality of distortion errors from the plural sets of measured values and which obtains a correlation where a focus offset quantity corresponds to an alignment compensation value to compensate for the distortion error with respect for a plurality of focus offset quantities, in response to the obtained plurality of first focus offset quantities and the obtained plurality of distortion errors, and wherein
each of the exposure apparatuses further includes:
a first determination unit that determines a target focus offset quantity when exposing a second substrate;
a second determination unit that determines an alignment compensation value for the determined target focus offset quantity, in response to the obtained correlation; and a control unit which controls a second focus offset quantity of the second substrate to reach the target focus offset quantity determined by the first determination unit, and which controls a planar position of the second substrate to reach a planar position corresponding to the alignment compensation value determined by the second determination unit.

17. The exposure control system according to claim 16, wherein
the control center further includes a storage unit which stores a correlation database in which correlation information corresponding to the correlation is associated with identification information of exposure apparatuses, for the plurality of exposure apparatuses.

18. The exposure control system according to claim 17, wherein
the control center reads out the correlation information corresponding to the exposure apparatus from the storage unit of the control center, and transmits the correlation information to the exposure apparatus via the communication line, when receiving an acquisition request for the correlation from the exposure apparatus via the communication line.

19. An exposure method comprising:
repeating an acquisition operation to obtain measured values of a plurality of alignment marks arranged on a first substrate while changing a first focus offset quantity for the first substrate;
obtaining plural sets of measured values that are measured for a plurality of first focus offset quantities different from each other, each set of measured values representing positional deviation distribution within a shot area;
obtaining a plurality of distortion errors from the plural sets of measured values;
correlating a focus offset quantity to an alignment compensation value to compensate for the obtained distortion error with respect to a plurality of focus offset quantities, in response to the obtained plurality of first focus offset quantities and the obtained plurality of distortion errors;
determining a target focus offset quantity when exposing a second substrate;
determining an alignment compensation value for the determined target focus offset quantity, in response to the obtained correlation;
controlling a second focus offset quantity of the second substrate to reach the target focus offset quantity determined by the first determination unit; and
controlling a planar position of the second substrate to reach a planar position corresponding to the determined alignment compensation value determined by the second determination unit.

20. The exposure method according to claim 19, wherein
the obtaining of the plurality set of measured values includes:
performing exposure on the first substrate, using an alignment mask on which a plurality of mask alignment marks are formed; and
obtaining positional deviation quantities of a plurality of alignment marks on the first substrate that correspond to the plurality of mask alignment marks, as the positional deviation distribution.

* * * * *